(12) United States Patent
Tsao et al.

(10) Patent No.: US 7,245,133 B2
(45) Date of Patent: Jul. 17, 2007

(54) INTEGRATION OF PHOTON EMISSION MICROSCOPE AND FOCUSED ION BEAM

(75) Inventors: Chun-Cheng Tsao, Cupertino, CA (US); Eugene Delenia, Morgan Hill, CA (US)

(73) Assignee: Credence Systems Corporation, Milpitas, CA (US)

( * ) Notice: Subject to any disclaimer, the term of this patent is extended or adjusted under 35 U.S.C. 154(b) by 154 days.

(21) Appl. No.: 10/985,808

(22) Filed: Nov. 9, 2004

(65) Prior Publication Data

US 2006/0012385 A1 Jan. 19, 2006

Related U.S. Application Data

(60) Provisional application No. 60/587,327, filed on Jul. 13, 2004.

(51) Int. Cl.
*G01R 31/302* (2006.01)
*G01L 21/30* (2006.01)

(52) U.S. Cl. .......................... 324/750; 216/61
(58) Field of Classification Search .............. 324/750; 250/306–311; 216/59–65
See application file for complete search history.

(56) References Cited

U.S. PATENT DOCUMENTS

| 5,091,692 | A | * | 2/1992 | Ohno et al. ................. 324/758 |
| 5,358,806 | A | * | 10/1994 | Haraichi et al. ................. 430/5 |
| 5,541,411 | A | * | 7/1996 | Lindquist et al. ............ 250/309 |
| 5,574,280 | A | * | 11/1996 | Fujii et al. ................... 250/309 |
| 5,844,416 | A | * | 12/1998 | Campbell et al. ........... 324/750 |
| 5,892,539 | A | | 4/1999 | Colvin ......................... 348/80 |
| 5,905,266 | A | * | 5/1999 | Larduinat et al. ....... 250/492.21 |
| 5,986,264 | A | * | 11/1999 | Grunewald .................. 250/310 |
| 6,043,882 | A | | 3/2000 | De Wolf ...................... 356/326 |
| 6,112,004 | A | | 8/2000 | Colvin ......................... 385/116 |
| 6,121,616 | A | * | 9/2000 | Trigg .................... 250/339.07 |
| 6,252,412 | B1 | * | 6/2001 | Talbot et al. ................ 324/750 |
| 2003/0046024 | A1 | * | 3/2003 | Duncan et al. .............. 702/155 |
| 2003/0102436 | A1 | | 6/2003 | Benas-Sayag ............... 250/398 |

* cited by examiner

*Primary Examiner*—Ha Tran Nguyen
*Assistant Examiner*—Roberto Velez
(74) *Attorney, Agent, or Firm*—Deborah Wenocur

(57) ABSTRACT

An integrated FIB/PEM apparatus and method for performing failure analysis on integrated circuits. In-situ failure analysis is enabled by integrating Photon Emission Microscopy into a Focused Ion Beam system, thereby improving throughput and efficiency of Failure Analysis. An iterative method is described for identifying and localizing fault sites on the circuit.

52 Claims, 7 Drawing Sheets

INTEGRATION OF PHOTON EMISSION MICROSCOPE AND FOCUSED ION BEAM

CROSS-REFERENCE TO RELATED APPLICATION

This application claims priority from U.S. Provisional Application No. 60/587,327, filed Jul. 13, 2004.

FIELD OF THE INVENTION

This invention pertains to failure analysis for integrated circuits, and in particular to the integration of two important tools used in failure analysis, i.e., photon emission microscope, and focused ion beam.

BACKGROUND OF THE INVENTION

An important process component of integrated circuit manufacturing is Failure Analysis (FA). Generally FA is performed in response to customer returns, which are in turn in response to product failure issues which take place in the field. Additionally, FA is utilized for design debug, i.e., the analysis of failures due to imperfection of designing or processing, and feedback to circuit designers or processing fabs to correct the problem or to improve production yields. Many IC failures are can be observed as "hot spots", i.e., spots where electroluminescence processes take place from failed devices exhibiting electrical current leakage. The hot spots are a symptom of the defect, not the failure itself. Therefore, the hot spots can occur at the actual site of a circuit short, or they can appear at a first location in response to a circuitry malfunction at a second location "upstream". These hot spots are most easily identified and localized by a tool known as the photon emission microscope (PEM), a widely used tool for the detection of low-level light emission from failed devices. The PEM is described in D. L. Barton, P. Tangyunyong, J. M. Soden, and A. Y. Liang, *Proceedings of $22^{nd}$ ISTFA*, p9, 1996, and U.S. Pat. Nos. 6,112,004 and 5,892,539, all of which are hereby incorporated by reference. The PEM is the quickest and the most effective tool for localizing hot spots, and does not require substantial a prior knowledge of the IC device. These aspects of the PEM make it the primary initial tool in the early phase of IC failure analysis, since in FA, the turn-around time is paramount. The customer generally requires the fastest possible response time, since entire product lines may depend on the reliability of the incorporated IC's.

Once the hot spot is localized, the next step is to determine the cause of the failure which has produced the hot spot. One technique used in this determination is to perform circuit edits such as cutting traces which may be triggering the hot spot, or by routing a new trace so as to avoid hot emission. This curcuit editing is generally performed using a Focused Ion Beam (FIB) in a FIB instrument. One such instrument is the OptiFIB manufactured by NPTest, LLC, described in U.S. patent application Ser. No. 10/239,293 (patent application Publication No. US 2003/0102436), which is hereby incorporated by reference in its entirety. Following the editing of the likely triggering traces, the device is tested or probed to verify that the failure is fixed. PEM can be utilized again as a probe tool to verify that the hot spot is gone as a result of the FIB edit. If the hot spot still exists, then the circuit edit process must be continued using the FIB until the failure is fixed.

The process outlined above is often iterative, i.e., requiring alternating between PEM and FIB tools multiple times. Switching between a stand-alone PEM and a FIB machine is time consuming and inefficient. For each switch, mapping between imaging and CAD layout tools, i.e., circuit registration, is required in order to locate features and/or devices. In addition, system set-up time (e.g., vacuum interface and pumping, electrical interface, and CAD loading) is also required each time the sample or stimulation tools are loaded into the system. An integrated PEM/FIB tool would enhance efficiency in failure analysis and debugging, since both circuit validation by PEM and circuit edit by FIB would be in-situ, i.e., no transfer between instruments would be necessary.

SUMMARY OF THE INVENTION

It is therefore an object of this invention to provide an apparatus and method for performing PEM and FIB operations in an integrated tool.

This object is met by modifying a photon-ion column FIB tool, in which the ion beam is concentric with an optical beam, to be able to perform in-situ photon emission probing.

DETAILED DESCRIPTION OF THE INVENTION

The present invention integrates a PEM with a FIB tool so as to accelerate FA. A FIB-optical dual beam system with a concentric beam axis is preferred, since the area of interest seen by both FIB and PEM is the same throughout the operation. The common focal plane of the FIB-optical dual beam system is also preferred, since it saves time in the FIB-PEM iteration process by minimizing the time of searching for features in the focal axis. For the convenience of direct comparison, field of view and magnification of both the optical and the FIB images should be adjusted so as to be identical, by adjusting the scan control voltages to the FIB electrostatic lenses. Simultaneous imaging is not required, but the capability of performing in-situ photon emission imaging as well as FIB circuit modification is required.

Figure 1:
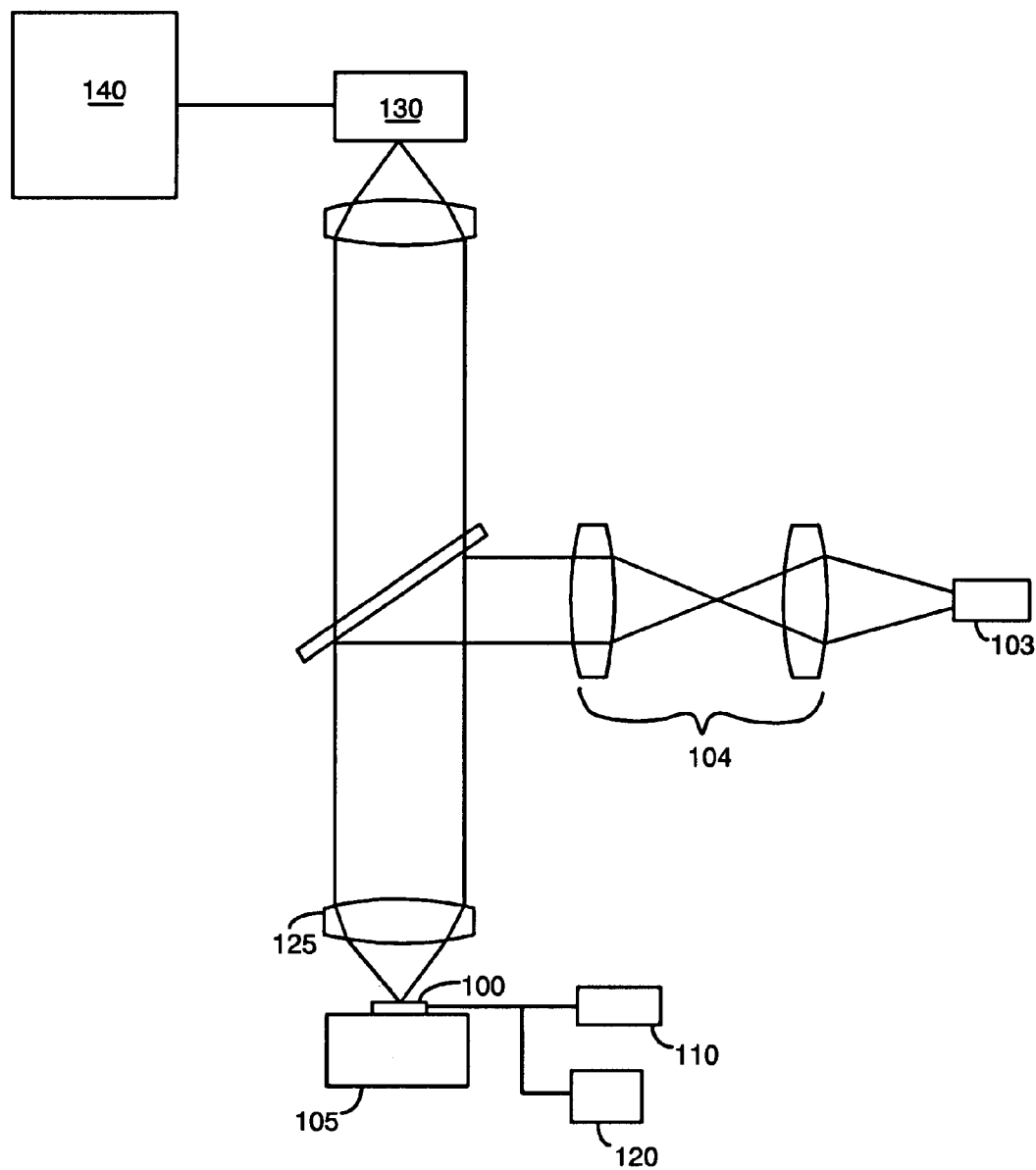
FIG. 1 is an illustration of a stand-alone PEM.

A Photon Emission Microscope, illustrated in FIG. 1, is a microscope designed for microscopic imaging of IC's with high detection efficiency with faint NIR emission. The major components of such a tool include: microscope tube with objective(s) 125, imaging sensor 130, illumination source 103 and optics 104, and specimen stage 105. Photon emission imaging, illustrated in FIG. 1, is generally performed by electrically stimulating the IC 100, either by simply powering the IC using a power supply 110 to place Vdd on the power line, or by connecting the IC to a tester unit 120. The tester unit can input a variety of electrical test patterns onto some or all of the IC input pins, and allows for static stimulation at a certain state, or semi-dynamic stimulation. Resulting photon emission due to device failure is collected by objective lenses 125, and detected by optical imaging detector 130. The reflected image and the emission image are acquired by a computer 140 from which the CAD image is loaded and correlated with the optical images for emission site localization. Since the photon emission tends to be concentrated in the 1-2 micron wavelength range, which is generally termed Near Infra-Red (NIR), the preferred optical imaging detector or camera is NIR-sensitive. Because of the need for an electrical interface to an electrical stimulation unit, it is preferred to use a FIB system capable of IC mounting which is tester docking friendly, such as the one in the OptiFIB system. In this system, the FIB column is oriented with the beam traveling upward and the IC sample mounted facing down. This allows open space on the back of the IC for accessing all varieties of stimulation tools.

Figure 2:
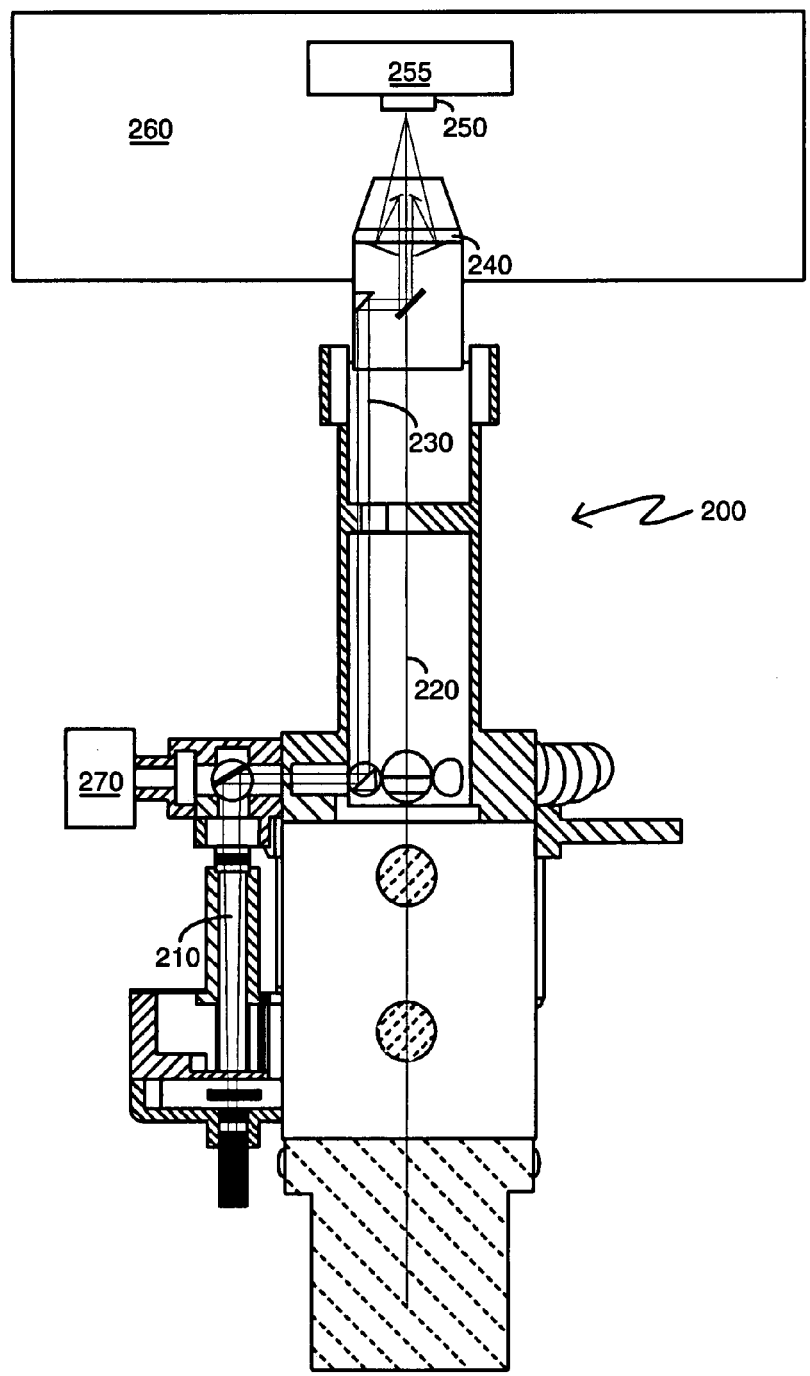
FIG. 2 is an illustration of a photon-ion column FIB tool.

The invention enables the integration of the PEM with the FIB tool by providing for a modified FIB-optical dual beam system such as the OptiFib manufactured by NPTest, so as to include the above-described PEM components. Other commercially available systems which utilize parallel FIB and optical beam paths can also be used with the inventive method, but the efficiency will be lower because they require extra time in shuttling the sample between paths and refocusing. FIG. 2 shows an example of an unmodified FIB-optical dual beam system 200, including light illumination unit 210 which is used for bright field imaging, ion beam 220 controlled by controller 225, optical beam 230, objective lens 240, Device Under Test (DUT) 250 mounted on z stage 255, vacuum housing 260, and optical detector 270, which may be by way of example a CCD camera. The lateral (xy) scanning of the FIB beam and image is accomplished by deflecting the ion beam electrostatically. The FIB image is generated by secondary electron detection synchronized with the beam scanning. Device navigation is accomplished by either laterally moving the FIB column, or by moving the DUT, for example with an xy stage.

Figure 3A:
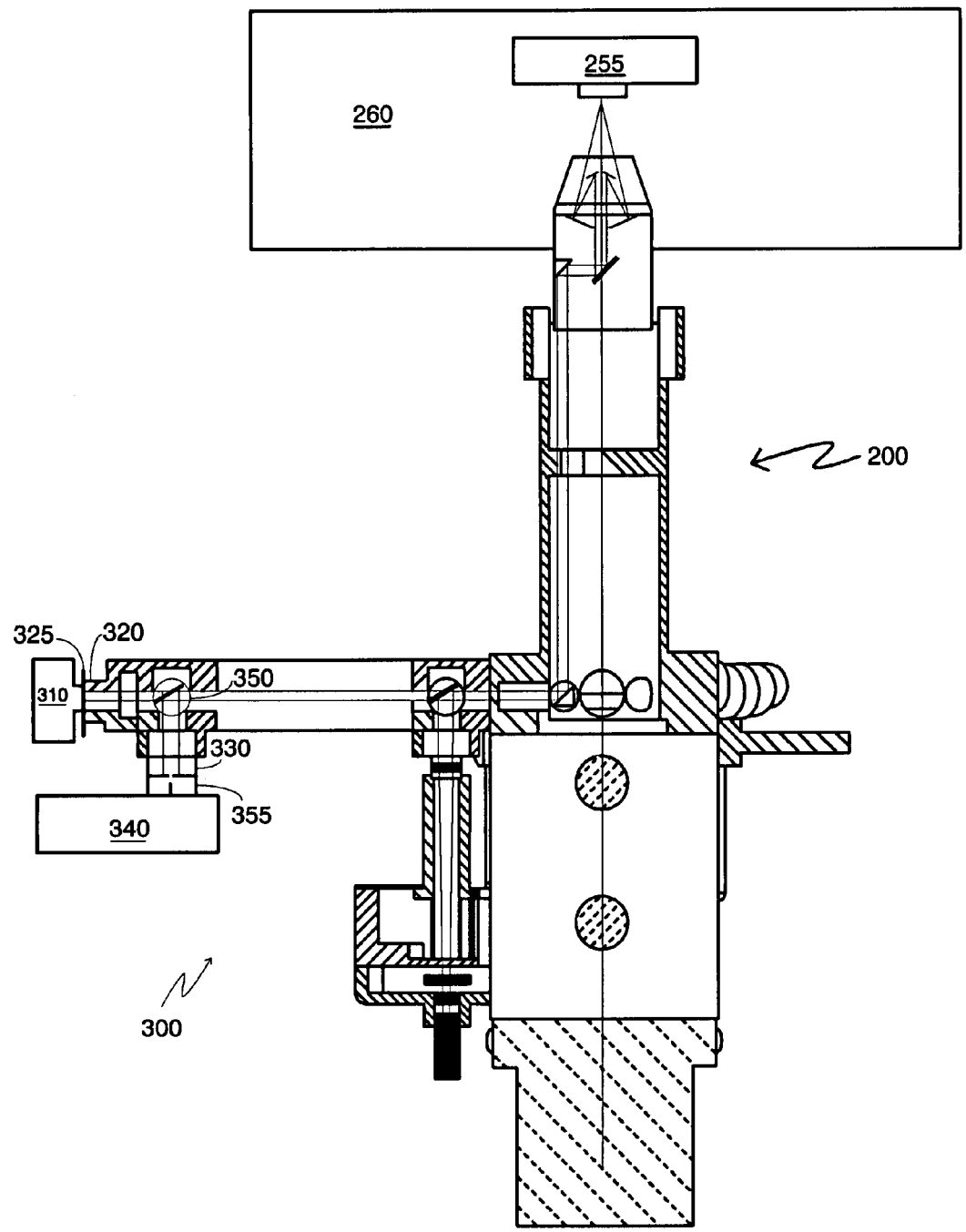
FIG. 3a is an illustration of an integrated PEM-FIB tool.

An example of a modified FIB-optical dual beam system 300, suitable for the inventive PEM-FIB technique, is illustrated in FIG. 3a. Visible-NIR sensitive detector 310, having efficient visible-NIR sensitivity, is coupled to optical port 320. Examples of possible detectors for detecting hot spot emission include but are not restricted to: NIR-sensitive CCD cameras, HgCdTe (MCT) focal plane array (FPA) cameras, InGaAs FPA cameras, and area sensors with high-gain amplification such as Intensified CCD (ICCD) cameras. The detector 310 serves dual functions: collecting the reflected image for device navigation, and collecting hot spot emission for FA. The navigation aspect is particularly important when imaging through planarized dielectric or through silicon substrate, i.e., backside imaging. FIB alone is not able to perform such imaging without the aid of an ultra-high accuracy stage, and at the expense of a lengthy excavation process.

Additional optional optical port 330 may be inserted to accommodate spectrometer 340. There are a number of mechanisms that generate photon emissions for which the emission spectra are different. The signature of the photon emission spectrum can help to identify the emission category, and to accelerate the failure diagnosis, when used in conjunction with the emission image and reflected image. This is described in U.S. Pat. No. 6,043,882, issued Mar. 28, 2000. Use of beam splitter 350 allows the spectral measurement to be simultaneous with the emission imaging. Aperture 355 that is size adjustable can be placed on the optical axis in front of the entrance of a spectrometer or a receiving fiber connecting to a spectrometer. This adjustable aperture can be an iris diaphragm or a set of knife-edge blades, which select the appropriate Field of View for the spectrometer. The spectral resolution of the spectrometer need not be higher than a few nanometers for the inventive application, since the fault emission tends to show a very broad spectral distribution. However, the spectral range must be broad in order to cover all of the possible emission signatures. The ideal spectral range includes both visible and NIR, i.e., 400 nm-2000 nm. Accordingly, the spectrometer sensor is preferably selected to be sensitive to both visible and NIR photons. A possible spectrometer configuration includes a VIS/NIR grating coupled with a linear Si CCD+InGaAs CCD, or a monochromator coupled with a single-element detector with QE (Quantum Efficiency) in the visible and NIR range.

A method known as hyperspectral imaging can be employed using this tool, in which spectroscopy is combined with imaging, i.e., images are formed for a large number of narrow, adjacent wavelength bands. A spectrum of emission vs. wavelength can then be obtained for each image area or pixel. A simple approach is to place a series of bandpass filters 325 in front of imaging sensor or detector 310, and to then acquire emission images of various wavelength bands. In this way, the benefits of both the camera for hot spot location, and the spectral signature to determine the nature of the localized fault, can be realized. The bandpass filter configuration can be, for example, a set of discrete interference filters on a wheel with mechanical control, or can alternately be a liquid crystal with electrical wavelength selection such as the VariSpec tunable imaging filter made by CRI Instruments.

Figure 3B:
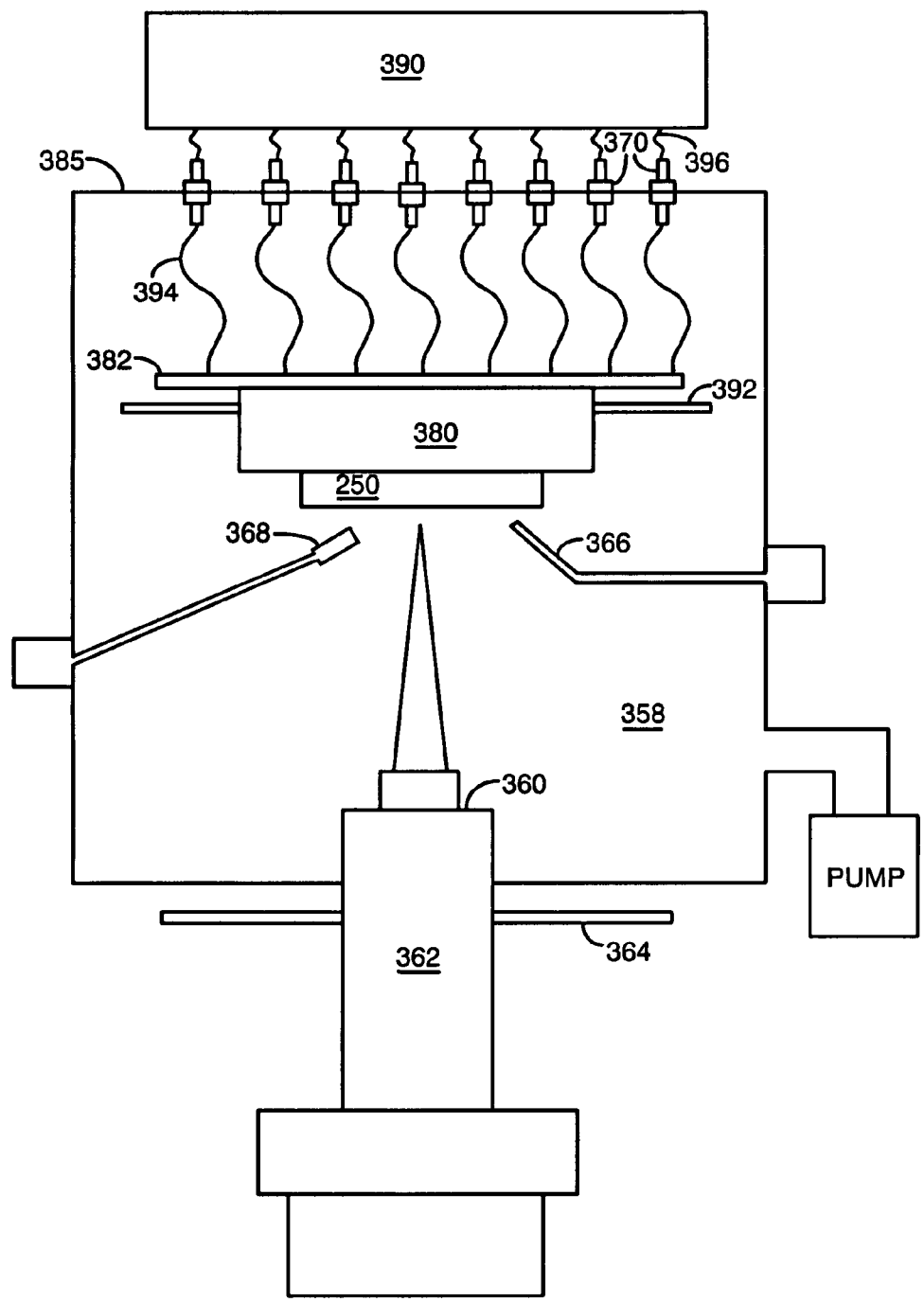
FIG. 3b is an illustration of the vacuum interface portion of the PEM-FIB tool, including sample mounting.

FIG. 3b shows an expanded view of the sample mounting and vacuum interface regions of the PEM-FIB system. Evacuated chamber 358 encompasses: beam-emitting end 360 of FIB/PEM column 362 (interchangeably described herein as an optical/FIB column), which is mounted on xy stage 364 which is generally outside the evacuated chamber (a sliding seal between the stage and vacuum chamber maintains the vacuum when the stage moves); DUT 250 (which may be mounted on socket 380 coupled to load module 382); gas nozzle 366 for providing chemical assistance to the FIB process; and charged particle detector, specifically secondary electron detector, 368 for generation of the FIB image. Vacuum interface 386 allows for electrical feedthroughs 370 on vacuum lid 385, which provides connection between DUT 250 and power supply, stimulus, or tester 390. In most cases, the hot spot can be located simply by powering up the device. Therefore, except in unusual circumstances, the vacuum interface can be as simple as two or three feedthroughs, for connecting the DUT to Vdd1, Vdd2 for some circuit designs, and ground. Either the DUT (as shown here) or the optical/FIB column should be mounted on a z stage 392 to provide focus adjustment on the vertical axis, since optical imaging has a small depth of focus (in the range of several microns to tens of microns). As a result, the connections between the socket where the DUT is mounted, and the vacuum lid with the electrical feedthroughs, must be flexible. One possible solution is a vacuum-compatible cable interface 394. A cable interface 396 is also preferred between the electrical feedthroughs on the exterior of the vacuum lid and the tester. A cable provides the vacuum feedthroughs with isolation from mechanical vibration coming from the tester head. This vibration can cause image feature drift and defocus, of particular concern during long exposure emission acquisition. It is also critical to avoid vibration during FIB operations. The configuration of the OptiFIB instrument, having the sample mounted at the top, is the preferred configuration in order to provide for contiguous space to mount the electrical feedthrough close to the sample and to allow for a massive interface to the tester, incorporating the elements described above.

Figure 4:
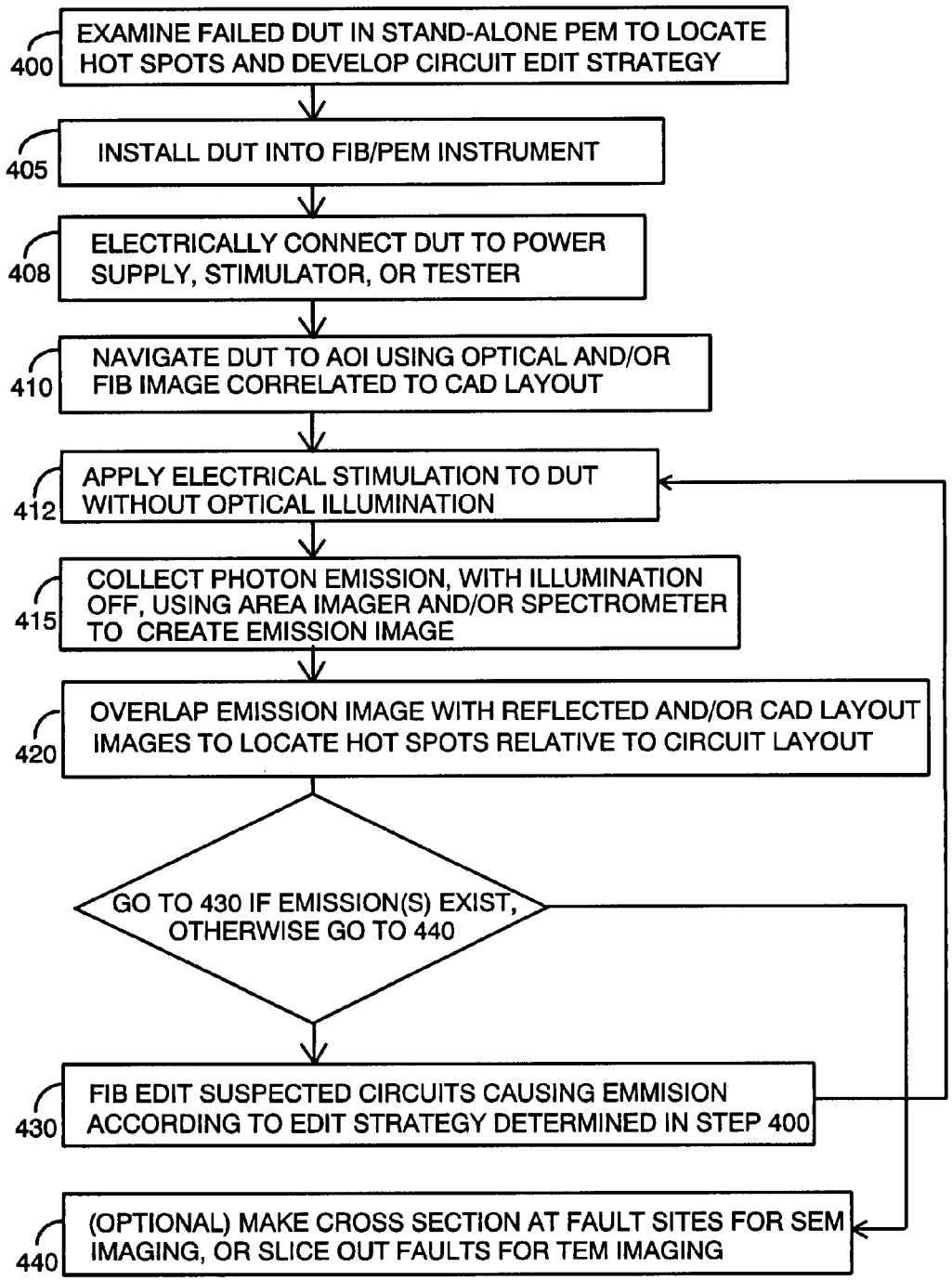
FIG. 4 is a flow chart of the inventive method.

FIG. 4 is a flow chart of an embodiment of the inventive method for using an integrated PEM/FIB instrument for failure analysis of an integrated circuit sample.

In step 400, the failed DUT is generally first examined in a stand-alone PEM tool with multiple objective lenses to quickly identify hot spots. This is suggested because the PEM integrated with the FIB has only one optical objective, and therefore one size of Field of View (FOV); therefore blind-searching for hot spots frame by frame is quite inefficient. In contrast, a stand-alone PEM tool is capable of imaging with multiple objective lenses of various powers, magnifications, and fields of view. Approximate location(s) of emission hot spot site(s) are quickly identified using a macro lens in the stand-alone PEM. More exact locations are found using higher-resolution objectives. These hot spot locations are then saved and linked to optical reflective images or to the CAD layout. FIB edit strategy is then determined according to the PEM observation combined with circuit analysis, and is generally determined by circuit designers. The integrated PEM/FIB tool is used thereafter, to confirm the hot spot(s) found by the stand-alone PEM, and to verify the repair result by remeasuring the hot spot, iteratively until the repair is successful.

In step 405, a sample including a Device Under Test (DUT) is mounted in the PEM/FIB instrument. The sample may either be a die packaged for front-side or backside access or probing, or it may be a whole wafer or a wafer portion. In the case of accessing the DUT from the backside, (whether packaged or in wafer form), the substrate is thinned and polished to improve signal-to-noise ratio. To enhance imaging quality and improve emission detection efficiency, an anti-reflection coating (ARC) may be applied on the polished substrate surface. If the DUT is packaged, it can be mounted on a socket 380 after preparation, i.e., thinning and polishing. The socket may be directly connected to electrical feedthroughs 370, or may be mounted on a load module 382 which in turn connects to electrical feedthroughs 370 via cable wires 394. All of the materials used in the electrical interface materials, including socket, load module, and cables, need to be vacuum compatible. If the DUT is not packaged, i.e., is a wafer or wafer portion, it is possible to contact the circuit directly to provide electrical stimulation, by such methods as using micromechanical probes inside the FIB chamber, such as those sold by Omniprobe.

In step 408, the DUT is connected electrically to either a DC power supply which is used to power up the device with Vdd, or to a dynamic electrical stimulator or a tester. In step 410, the DUT is navigated to the Area of Interest (AOI) by observing the optical and/or FIB image, which are linked to the CAD layout as described hereinafter. As described in step 400, the AOI has generally been identified prior to the FIB operation by other failure analysis means such as wide-field PEM, or alternatively liquid crystal hot-spot detection The inventive method is directed at those types of faults which produce hot spots or other PEM detectable changes, in order for the integrated PEM/FIB to provide added value such as improved throughput. The AOI may not be exactly the site responsible for the failure, but is the site showing the symptom of the failure, i.e., photon emission. For samples where the FIB beam is not able to show contrast, such as a Chemical-Mechanically Polished (CMP) device, or through the backside of a device, the navigation is done by optical imaging using the optical channel of the OptiFIB system. For non-CMP devices, the FIB can generally be used to navigate on the front side of the die.

The navigation process generally starts with linking the xy stage to the CAD layout by correlating the optical or FIB image to the CAD layout image. This link is generally accomplished by correlating images at the four corners of the die, to establish global validity of the link. In particular, when the tool navigates to search for the AOI, the optical image sensor is run in reflected imaging mode with external illumination. The illumination can be bright-field or dark-field type. The illumination may be in the visible range for front-side imaging, but must be NIR when imaging through the silicon backside of the device. Wavelength filtering may be positioned in the illumination optics, or may be in from of the imaging sensor. The wavelength filter may comprise a bandpass filter such as coated glass, or a voltage-controlled liquid crystal. The DUT is navigated against the CAD layout (the CAD database may also assist in navigation) to identify the AOI. Once the AOI is identified, the optical reflected image (and/or the FIB image, if available) and the CAD layout image, are taken and saved, as well as the coordinates of the AOI.

In step 412, with the stage stationary, electrical stimulation is applied to the DUT after discontinuing the optical illumination.

In step 415, the photon emission due to recombination or ohmic heating is passively collected in a dark chamber by 1) an area imager such as the previously mentioned NIR-sensitive CCD cameras, MCT cameras, InGaAs cameras, and cameras with intensifiers; 2) a spectrometer combined with a field aperture to select the point of interest, and/or 3) a hyperspectral imaging system comprising an area imager combined with adjustable spectral filters. The photon emission is generally collected using the same optical path and camera as the one used in the reflected imaging. Therefore the emission image can be directly overlapped with the reflected without the necessity for image calibration. In contrast, to overlap the emission image onto the FIB image, careful image calibration must be performed beforehand to correct image distortion coming from optical and/or FIB images. The emission photon flux is generally weak, and therefore requires longer camera acquisition time and higher signal gain than does imaging, i.e., reflected imaging, with illumination. The acquisition time may be as short as a fraction of a second, and may range up to tens of minutes. Factors which determine optimal emission acquisition include: the nature and location of the emission, the emission site, silicon thickness, and the applied voltage. Longer acquisition time generally results in a higher noise level, which may show up as apparent emission spots in the emission image. To eliminate such spurious apparent spots, a background subtraction is usually applied: Immediately after the emission image is taken, the same Field of View (FOV) image is taken again using exactly the same imaging parameters such as exposure, gain, and offset, but without electrical stimulation applied to the DUT. This background image is then subtracted from the emission image. The resulting image shows only emission spots on a dark background. Efficiency of fault analysis can be further improved using some basic image processing software applications, including: contrast adjustment with histogram, mathematical filtering of the image, false color presentation, and image overlap function.

Figure 5:
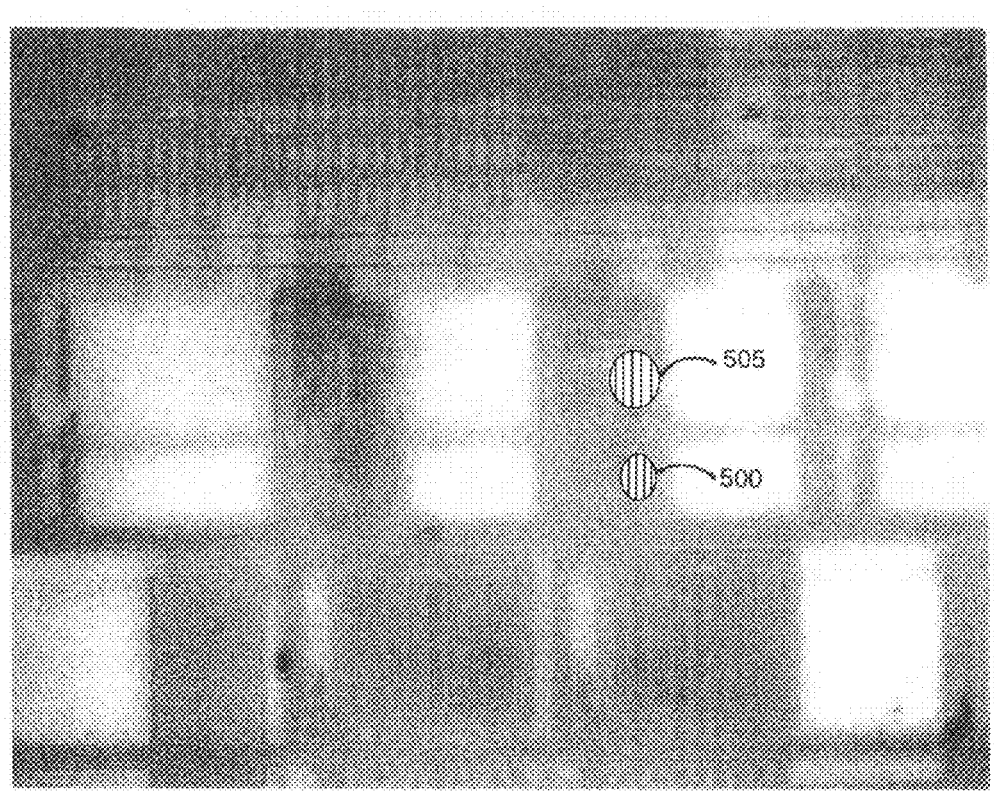
FIG. 5 shows an overlapped emission image and reflected image, showing hot spots.

In step 420, the emission image is overlapped with either the reflected image of step 410, or with the CAD layout, to locate the position(s) of the hot spot(s) relative to the circuit layout. The accuracy of overlaying the hot spot detected by the camera onto the corresponding CAD layout depends on 1) the degree of optical image distortion, and 2) the accuracy of the link between the acquired image and the CAD image. The first of these issues can be addressed by an optical system calibration for the FOV in question. The distortion of the optical image can be characterized against a calibrated target. The second issue can be addressed using software algorithms which calculate the image offset based on the feature content in the reference image. This technique is described in "*Sub-resolution placement using IR image alignment to the CAD database for backside probing and editing*", EIPBN 2001, M. Sengupta, M. Sinha, G Dagee, and C. C. Tsao. Prior to the overlapping, the emission image may be processed to enhance contrast and apply color, if necessary. FIG. 5 shows an overlapped emission image and reflected image, showing hot spots 500 and 505. This data was taken using an NPTest IDS OptiFIB column and a Si CCD camera with 60 second exposure. (Si CCD has some residual sensitivity in the near portion of the NIR spectrum, between 700 nm and 1050 nm. Since most of the emissions are in the range of 1-2 microns, a Si CCD camera is not the preferred tool for emission detection, though it can be used, albeit less efficiently than a NIR camera.) The device was powered up at a nominal Vcc of 3.3 V. In this case, current leakage in the input buffer circuitry created the emission in the hot spots.

In step 430, with electrical stimulation off, the suspected metal routes are altered, i.e. cut or re-routed using the FIB, according to the circuit analysis and edit strategy, developed in step 400 from the stand-alone PEM results, confirmed in step 420. (There will be no discrepancy between the stand-alone results and the integrated PEM/FIB results unless the status of the device is altered between probing by the stand-alone PEM and the FIB-PEM). This method is described in "*Basic technology and practical applications of focused ion beam for the laboratory workplace*", S. B. Herschbein, L. S. Fischer, and A. D. Shore, *Microelectronic Failure Analysis Desk Reference 4th edition*, pp 517-526. The concentric design of the FIB with the PEM allows in-situ FIB edit soon after the suspected routes are identified. The process of emission analysis, edit route determination, and FIB placement generally is accomplished jointly by circuit designers and FA engineers. However the process can be further automated with an intelligence-based failure analysis algorithm. Additionally, the process of FIB edits followed by PEM acquisition can be automated as follows: A series of discrete FIB processes, e.g., cutting or re-routing of a single trace, can be pre-programmed, followed by the steps of PEM acquisition, i.e., moving the known PEM feature to the center of the FOV, acquiring PEM images using the same operation parameters as those used before the FIB operation, and comparing the two PEM images from before and after the FIB operation.

Following step 430, steps 412, 415, and 420 are repeated (step 410 may be repeated if the DUT has been moved away from the AOI). The emission pattern and intensity can be compared qualitatively and/or quantitatively before and after the FIB edits. If emission still exists, the FIB-PEM cycle comprising steps 430, 412, 415, and 420 is repeated until emission data supports the validation of circuit edits. The cycle of altering metal routes by FIB and imaging by PEM is continued with a narrower and narrower scope until the precise metal route(s) causing the hot spot(s) are determined and located. There can be several iterations before the root cause of the failure is identified.

Figure 6A:
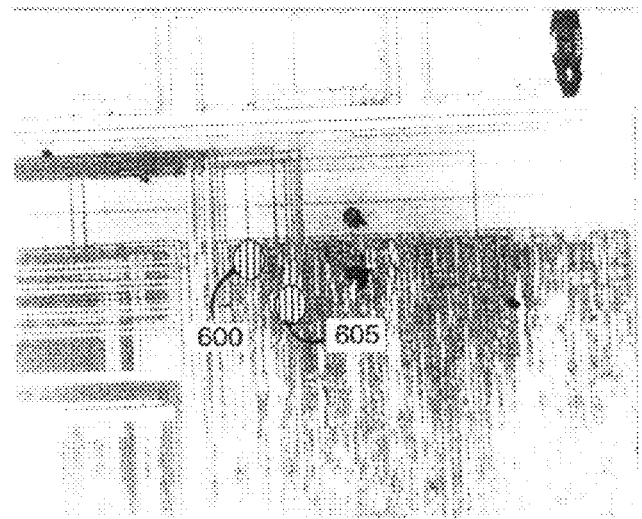
FIG. 6a shows an emission image before FIB edit, showing hot spots.
Figure 6B:
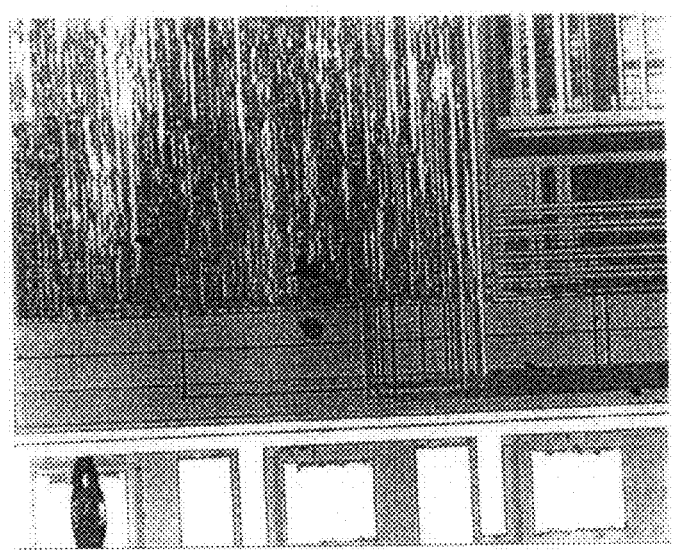
FIG. 6b shows an emission image as in FIG. 6a, after FIB edit.

An example of coordinating FIB editing with PEM validation is shown in FIG. 6. FIG. 6a shows an emission image having excess leakage current at a large buffer circuitry, at locations 600 and 605. The buffer is driven by a tri-state bus driver which is suspected to be floating and causing a Vdd-to-ground short in the buffer circuitry downstream. FIB is used to re-route the driver circuit so as to enable the driver output and to stop the short leading to the current leakage. Emission is expected to disappear after the edit. FIG. 6b shows the emission image of the same area after the FIB edit. The hot emission has disappeared, demonstrating the validation of defect localization and circuit edit by FIB. Further quiescent current (Iddq) testing verified the result.

In step 440, which is optional (though generally done in FA), further confirmation of faults are done with SEM and/or TEM imaging. While still in a FIB/PEM chamber, a cross section is made by FIB at the suspected fault site, and the cross section is viewed with an SEM or the site is sliced out by FIB and imaged with TEM. The purpose of this cross sectioning is to physically observe the fault and to provide feedback for the process or design. FIB is a powerful and effective tool for doing a cross section or TEM sample preparation, as is described in "*Mass production cross-section TEM samples by focused ion beam masking and reactive ion etching*", L. Y. Tsung, A Anciso, R. Turner, T Dixon, and N. Holloway, *Proceedings of ISTFA* 2001, pp 299-302. As a result, the cross sectioning can be done in the same integrated FIB-PEM instrument immediately following the defect localization by PEM/FIB iteration. Therefore it is possible to do a complete failure analysis in a single integrated FIB-PEM instrument.

The present invention provides for an improved apparatus and method to enable integrated PEM-FIB for use in circuit failure analysis. The invention facilitates greatly improved efficiency and turnaround time for the FA. This is because the multiple transfers of the sample between systems, including circuit registration as well as set-up time, are avoided.

It is not intended that the invention be restricted to the exact embodiments described herein. Those skilled in the art will recognize that changes and modifications may be made without departing from the inventive concept. For example, details of the optical path or the electrical and vacuum feedthroughs may be modified, as well as the imaging and navigation techniques. It is also believed that FIB editing of circuit features other than metal routes, such as active regions, according to the methods disclosed herein, is feasible and will provide additional flexibility in the editing process. The scope of the invention should be construed in view of the claims.

With this in mind, we claim:

1. An integrated FIB/PEM apparatus for conducting failure analysis on an integrated circuit sample, comprising:
   an evacuated chamber having a sample holder therein, said evacuated chamber having a feedthrough therethrough for connecting an electrical stimulus to said sample, and having an electrical connection from said feedthrough for connecting to said sample;
   an optical beam from a light source directed into a column, said optical beam to be focused onto a sample held in said sample holder, said optical beam in said column having an optical beam axis;
   an optical imaging detector for detecting and imaging photon emission from said sample;
   an ion beam from an ion source in said column, with associated optics to direct and focus said ion beam onto said sample, said ion beam having an ion beam axis;

a charged particle detector for detecting and imaging charged particles emitted from the interaction of the ion beam and the sample; and a controller for controlling said focused ion beam to perform circuit modification on said sample.

2. The apparatus of claim 1, wherein said optical beam axis and said ion beam axis are concentric.

3. The apparatus of claim 2, wherein said optical beam and said ion beam have a common focal plane.

4. The apparatus of claim 1, wherein said optical imaging detector is sensitive in the visible-NIR range.

5. The apparatus of claim 4, wherein said optical imaging detector is selected from the group consisting of: NIR-sensitive CCD cameras, HgCdTe (MCT) focal plane array (FPA) cameras, InGaAs FPA cameras, area sensors with high-gain amplification, and Intensified CCD (ICCD) cameras.

6. The apparatus of claim 1, further including x,y, and z stages to change the relative positions of the sample and said column.

7. The apparatus of claim 1 wherein said electrical connection is multiple.

8. The apparatus of claim 1, wherein said electrical connection between said feedthrough and said sample holder is flexible.

9. The apparatus of claim 1, further including a gas nozzle to direct a chemical assist at said sample during FIB operations.

10. The apparatus of claim 1, further including a spectrometer arranged to collect and analyze photon emission from said sample.

11. The apparatus of claim 10, wherein said spectrometer has a spectral wavelength range of at least 400 nm- 2000 nm.

12. The apparatus of claim 11, wherein said spectrometer has a configuration selected from the group consisting of: a VIS/NIR grating coupled with a linear Si CCD+InGaAs CCD; and a monochromator coupled with a single-element detector with QE (Quantum Efficiency) in the visible and NIR range.

13. The apparatus of claim 1, further including a wavelength adjustable bandpass filter arranged to select from a plurality of narrow adjacent wavelength bands of photon emission from said sample incident on said imaging detector.

14. The apparatus of claim 13, wherein said bandpass filter comprises a set of discrete interference filters on a wheel with mechanical control.

15. The apparatus of claim 13, wherein said bandpass filter comprises a liquid crystal with electrical wavelength selection.

16. The apparatus of claim 1, wherein said system provides room proximal said sample for a massive tester interface.

17. The apparatus of claim 16, wherein said chamber is oriented with said sample holder at the top.

18. A method for performing failure analysis on a sample having an integrated circuit therein, comprising:
a) installing said sample into an integrated FIB/PEM apparatus for conducting failure analysis on an integrated circuit sample, the apparatus comprising:
1) an evacuated chamber having a sample holder therein, said evacuated chamber having a feedthrough therethrough for connecting an electrical stimulus to said sample, and having an electrical connection from said feedthrough for connecting to said sample;
2) an optical beam from a light source directed into a column, said optical beam to be focused onto a sample held in said sample holder, said optical beam in said column having an optical beam axis;
3) an optical imaging detector for detecting and imaging photon emission from said sample;
4) an ion beam from an ion source in said column, with associated optics to direct and focus said ion beam onto said sample, said ion beam having an ion beam axis;
5) a charged particle detector for detecting and imaging charged particles emitted from the interaction of the ion beam and the sample; and
6) a controller for controlling said focused ion beam to perform circuit modification on said sample;
b) electrically stimulating said integrated circuit in said sample;
c) imaging photon emission from said sample;
d) identifying and determining the positions of photon emission hot spots on a surface of said sample relative to said integrated circuit;
e) determining an edit strategy according to an analysis of the positions of the photon emission hot spots with respect to the integrated circuit layout;
f) modifying said integrated circuit with said focused ion beam to edit suspected circuit features causing said photon emission hot spots, according to said positions of said photon emission hot spots;
g) repeating steps b)-d); and
h) repeating steps e), f), and g) until circuit features causing said photon emission hot spots are determined and located, thereby locating a fault site.

19. The method of claim 18, wherein said edited circuit features causing photon emission hot spots comprise metal routes.

20. The method of claim 18, wherein step b) comprises: connecting an electrical input to the electrical feedthrough in the vacuum interface, and connecting the electrical feedthrough to the sample so as to stimulate the integrated circuit in the sample.

21. The method of claim 20, wherein said integrated circuit in said sample is not packaged, and wherein the connecting of the electrical feedthroughs to the sample includes directly contacting the circuit.

22. The method of claim 20, wherein the integrated circuit in said sample is packaged and mounted on a socket, and wherein the connecting of the electrical feedthroughs to the sample includes connecting to input pins on the package via the socket with electrical cables.

23. The method of claim 18, wherein step b) comprises powering up the integrated circuit with at least one Vdd input and a ground input, using a power supply.

24. The method of claim 18, wherein step b) of electrically stimulating said integrated circuit comprises providing dynamic tester input to said integrated circuit.

25. The method of claim 18, wherein said step c) of imaging photon emission from said sample comprises collecting photon emission with an area imager.

26. The method of claim 25, wherein said area imager is selected from the group consisting of: NIR-sensitive CCD cameras, MCT cameras, InGaAs cameras, and cameras with intensifiers.

27. The method of claim 25, wherein said step of collecting photon emission with an area imager comprises forming a series of photon emission images for a large number of narrow, adjacent wavelength bands.

28. The method of claim 27, wherein said step of forming a series of photon emission images for a large number of narrow, adjacent wavelength bands comprises:

selecting a first narrow wavelength band of said photon emission to be incident on said area imager;

imaging said first narrow wavelength band of said photon emission; and repeating said step of selecting and imaging for a large number of said narrow, adjacent wavelength bands.

29. The method of claim 28, wherein said step of selecting a first narrow wavelength band comprises passing said photon emission through a first of a series of bandpass filters in front of said area imager.

30. The method of claim 29, wherein said step of passing said photon emission through a first of a series of bandpass filters in front of said area imager comprises mechanically moving a first discrete interference filter on a wheel to a position in front of said area imager.

31. The method of claim 29, wherein said step of passing said photon emission through a first of a series of bandpass filters in front of said area imager comprises electrically selecting a wavelength band on an adjustable liquid crystal filter in front of said area imager.

32. The method of claim 18, wherein said step c) of imaging photon emission from said sample comprises collecting photon emission with a spectrometer.

33. The method of claim 32, further including the step of analyzing the photon emission spectrum with said spectrometer, to determine the nature of the emission.

34. The method of claim 18, wherein said step c) of imaging photon emission from said sample further includes doing a background subtraction.

35. The method of claim 34, wherein doing a background subtraction includes the steps of:

taking a first emission image while electrically stimulating the integrated circuit;

discontinuing the electrical stimulation of the integrated circuit; then taking a second emission image with the same Field of View as the first emission image, and using identical imaging parameters including exposure, gain, and offset; and subtracting the second emission image from the first emission image.

36. The method of claim 18, wherein said step d) of identifying and determining the positions of photon emission hot spots on a surface of said sample relative to said integrated circuit comprises overlapping the emission image with a corresponding CAD layout image of the sample.

37. The method of claim 18, wherein said step f) of modifying said integrated circuit with said focused ion beam to edit suspected metal routes causing said photon emission hot spots, according to said positions of said photon emission hot spots, comprises cutting routes suspected of causing said hot spots.

38. The method of claim 18, wherein said step f) of modifying said integrated circuit with said focused ion beam to edit suspected metal routes causing said photon emission hot spots, according to said positions of said photon emission hot spots, comprises re-routing routes suspected of causing said hot spots.

39. The method of claim 18, wherein step h) includes:

comparing photon emission images before and after each FIB edit;

if the photon emission has disappeared, discontinuing the editing process since the FIB edit is successful and the fault isolation is confirmed;

if the photon emission image has not changed after a FIB edit, continuing additional FIB editing until a change occurs in the photon emission image.

40. The method of claim 18, further including the step of:

before step a), determining the positions of photon emission hot spots on said sample.

41. The method of claim 40, wherein said step of, before step a), determining the positions of photon emission hot spots on said sample, comprises examining said sample in a stand-alone PEM tool.

42. The method of claim 41, wherein said stand-alone PEM tool has multiple objective lenses, including a wide-field objective lens.

43. The method of claim 40, wherein said step of, before step a), determining the positions of photon emission hot spots on said sample, comprises examining said sample using liquid crystal hot spot detection.

44. The method of claim 40, further including the step of, after determining the positions of photon emission hot spots on said sample, and before step c), navigating to an Area of Interest (AOI) showing a photon emission hot spot.

45. The method of claim 44, wherein said step of navigating to an AOI utilizes optical imaging with a PEM image sensor.

46. The method of claim 45, wherein said step of navigating to an AOI comprises:

optically imaging the sample using the PEM image sensor in reflected imaging mode with external illumination;

correlating the optical image to a corresponding CAD layout image of the sample; and navigating the sample to the AOI against the CAD layout.

47. The method of claim 44, wherein said step of navigating to an AOI utilizes FIB imaging.

48. The method of claim 40, further including the step of: after determining the positions of photon emission hot spots on said sample and before step a), developing an initial circuit edit strategy according to a circuit analysis and according to the positions of the photon emission hot spots.

49. The method of claim 18, further including the step of forming a cross section of the sample at the fault site for SEM imaging.

50. The method of claim 49, wherein the step of forming the cross section is done with a FIB beam, in situ in the FIB/PEM apparatus.

51. The method of claim 18, further including the step of making a TEM slice for TEM imaging.

52. The method of claim 51, wherein the step of making a TEM slice in done with a FIB beam, in situ in the FIB/PEM apparatus.

* * * * *